US012712433B1

(12) United States Patent
D'Amico et al.

(10) Patent No.: US 12,712,433 B1
(45) Date of Patent: Aug. 18, 2026

(54) APPLIANCE WITH MODULAR FULL-BRIDGE DRIVER AND DC SOURCE

(71) Applicant: Impulse Labs, Inc., San Francisco, CA (US)

(72) Inventors: Samuel Redmond D'Amico, San Francisco, CA (US); Bradley James Tallon, Arcadia, CA (US); Samuel William Lenius, Palo Alto, CA (US); Jacob Russell Davis, Albany, CA (US)

(73) Assignee: Impulse Labs, Inc., San Francisco, CA (US)

( * ) Notice: Subject to any disclaimer, the term of this patent is extended or adjusted under 35 U.S.C. 154(b) by 0 days.

(21) Appl. No.: 19/461,479

(22) Filed: Jan. 27, 2026

Related U.S. Application Data

(62) Division of application No. 19/292,752, filed on Aug. 6, 2025.

(51) Int. Cl.

| | |
|---|---|
| ***H02M 1/00*** | (2007.01) |
| ***G01R 31/00*** | (2006.01) |
| ***H02M 1/44*** | (2007.01) |
| ***H02M 7/00*** | (2006.01) |
| ***H02M 7/48*** | (2007.01) |

(Continued)

(52) U.S. Cl.
CPC ........ *H02M 1/0083* (2021.05); *G01R 31/002* (2013.01); *H02M 1/0009* (2021.05); *H02M 1/44* (2013.01); *H02M 7/003* (2013.01); *H02M 7/4815* (2021.05); *H02M 7/539* (2013.01); *H05B 6/04* (2013.01); *H05B 6/06* (2013.01)

(58) Field of Classification Search
CPC ............. H02M 1/0083; H02M 7/4815; H02M 1/0009; H02M 1/44; H02M 7/003; H02M 7/539; H05B 6/04; H05B 6/06; G01R 31/002
USPC ....... 219/667, 660, 661, 662, 664, 668, 670, 219/671, 672
See application file for complete search history.

(56) References Cited

U.S. PATENT DOCUMENTS

| | | | |
|---|---|---|---|
| 5,250,775 | A | 10/1993 | Maehara et al. |
| 10,090,777 | B2 | 10/2018 | Dent |

(Continued)

OTHER PUBLICATIONS

U.S. Appl. No. 19/461,483, Non-Final Office Action mailed May 13, 2026; Inventor D'Amico, Samuel Redmond et al.; 8 pages.

*Primary Examiner* — Quang T Van
(74) *Attorney, Agent, or Firm* — COOLEY LLP

(57) ABSTRACT

An apparatus includes a DC source configured to supply a first DC output during operation of a first appliance. The DC source is configured to supply a second DC output during operation of a second appliance. The first DC output differs from the second DC output. The apparatus includes a communication interface configured to be communicatively coupled with a communication bus of the first appliance. The apparatus includes a processor that is communicatively coupled to the communication interface. The processor is configured to generate, in response to receiving a first signal, a second signal indicating a switching frequency. The apparatus includes a full bridge circuit electrically coupled to the DC source and a remaining portion of the first appliance. The full bridge circuit is configured to generate, based on the second signal, an AC output during operation of the first appliance to cause induction heating of a target material.

20 Claims, 5 Drawing Sheets

(51) Int. Cl.

| | |
|---|---|
| ***H02M 7/539*** | (2006.01) |
| ***H05B 6/04*** | (2006.01) |
| ***H05B 6/06*** | (2006.01) |

(56) References Cited

U.S. PATENT DOCUMENTS

| | | | | |
|---|---|---|---|---|
| 11,395,378 | B2 | 7/2022 | Jung et al. | |
| 2010/0170893 | A1 | 7/2010 | Breuninger et al. | |
| 2015/0237680 | A1 * | 8/2015 | Ono ........................ | H05B 6/06 219/662 |
| 2016/0323937 | A1 * | 11/2016 | Anton Falcon ........ | H05B 6/062 |
| 2022/0045511 | A1 | 2/2022 | Clifton | |
| 2022/0330388 | A1 | 10/2022 | Bassill et al. | |
| 2024/0356440 | A1 | 10/2024 | Tsuruta | |
| 2025/0071864 | A1 | 2/2025 | Faraji-Tajrishi et al. | |

* cited by examiner

500

RECEIVING A FIRST MEASUREMENT VALUE FROM A SENSOR, THE FIRST MEASUREMENT VALUE BEING REPRESENTATIVE OF A PROPERTY OF A CONDUCTIVE MATERIAL DISPOSED ON AN APPLIANCE

505

GENERATING A SIGNAL BASED ON A FIRST DIFFERENCE BETWEEN THE FIRST MEASUREMENT VALUE AND A TARGET VALUE THAT IS INPUT TO THE APPLIANCE

510

SWITCHING A FULL-BRIDGE CIRCUIT TO GENERATE AN ALTERNATING-CURRENT (AC) OUTPUT BASED ON THE SIGNAL, THE FULL-BRIDGE CIRCUIT BEING ELECTRICALLY COUPLED TO A DIRECT-CURRENT (DC) BUS OF THE APPLIANCE, THE DC BUS BEING ELECTRICALLY, REMOVABLY COUPLED TO A DC SOURCE

515

APPLYING THE AC OUTPUT TO AN INDUCTION COIL TO PRODUCE AN ALTERNATING MAGNETIC FIELD THAT INDUCTIVELY HEATS THE CONDUCTIVE MATERIAL AND THAT IS AT LEAST PARTIALLY SHIELDED BY AN ELECTROMAGNETIC INTERFERENCE (EMI) SHIELD

520

RECEIVING A SECOND MEASUREMENT VALUE FROM THE SENSOR BASED ON THE ALTERNATING MANGETIC FIELD, THE SECOND MEASUREMENT VALUE BEING REPRESENTATIVE OF THE PROPERTY OF THE CONDUCTIVE MATERIAL, A SECOND DIFFERENCE BETWEEN THE SECOND MEASUREMENT VALUE AND THE TARGET VALUE BEING LESS THAN THE FIRST DIFFERENCE

525

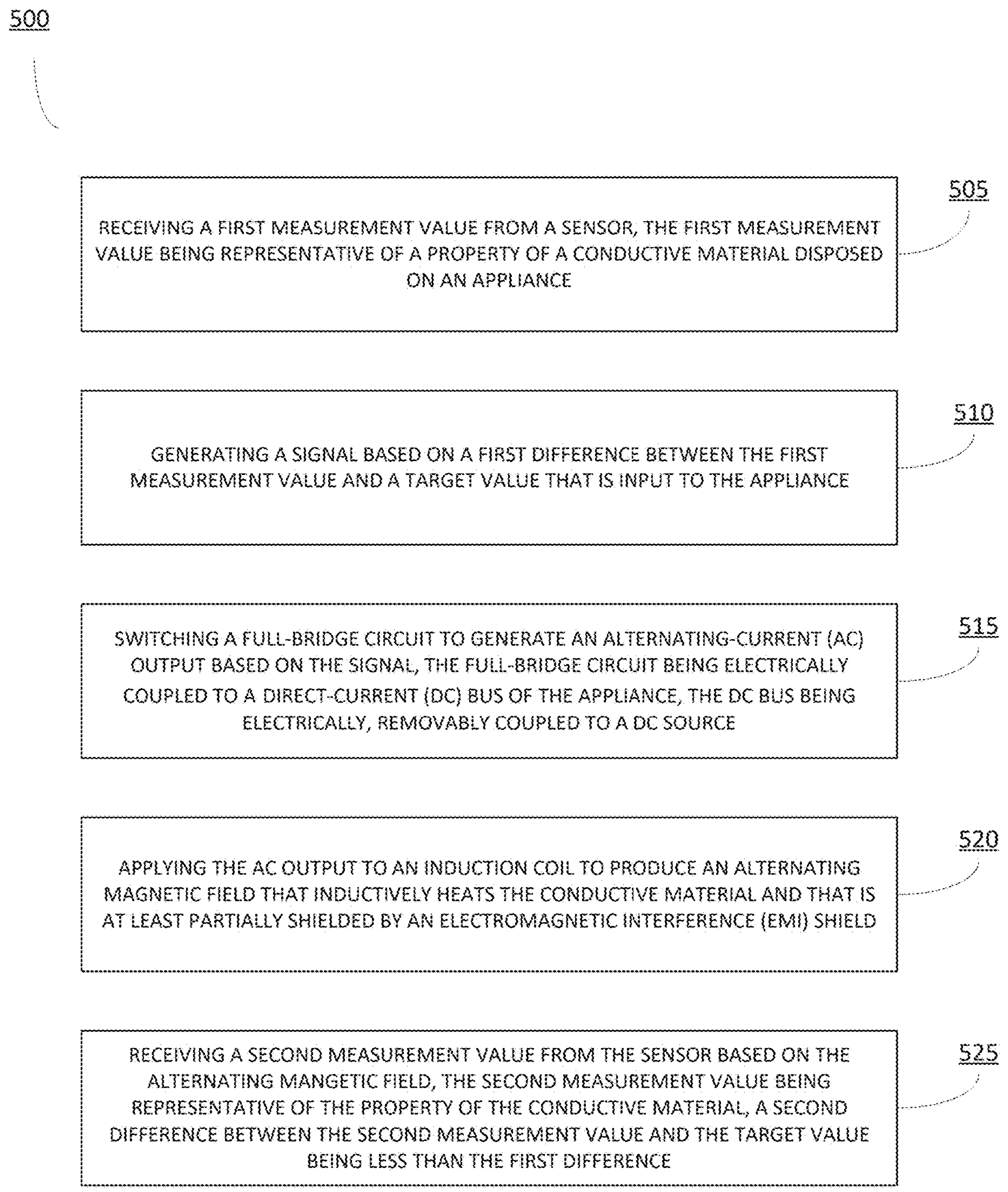

FIG. 5

APPLIANCE WITH MODULAR FULL-BRIDGE DRIVER AND DC SOURCE

CROSS REFERENCE TO RELATED APPLICATION

This application is a divisional of U.S. patent application Ser. No. 19/292,752, filed Aug. 6, 2025, titled "Appliance with Modular Full-Bridge Driver and DC Source," which is incorporated herein by reference in its entirety.

TECHNICAL FIELD

The present application relates to a DC source and a full bridge driver that can support the operation of appliances.

BACKGROUND

Demand is growing for high power appliances that operate using low DC bus voltages. Many known systems are designed for grid-connected environments and operate from rectified high-voltage AC mains (230-240 V), producing DC bus voltages of 325 V or higher. Operating at high voltage not only increases the risk of electric shock and complicates insulation and certification requirements but also limits the use of known systems in off-grid or low-voltage applications. Moreover, known systems using half-bridge or quasi-resonant topologies often do not deliver sufficient power from a lower DC voltage source (e.g., 115 V), resulting in inferior performance and inefficient energy transfer. Therefore, a need exists for systems and methods that can deliver sufficient power to appliances from low DC bus voltages.

SUMMARY

In some embodiments, an apparatus includes a direct-current (DC) source configured to supply a first DC output during operation of a first appliance. The DC source is configured to supply a second DC output during operation of a second appliance. The first DC output differs from the second DC output. The apparatus also includes a communication interface configured to be communicatively coupled with a communication bus of the first appliance. The apparatus also includes a processor that is communicatively coupled to the communication interface. The processor is configured to generate, in response to receiving a first signal, a second signal indicating a switching frequency. The apparatus also includes a full bridge circuit electrically coupled to the DC source and a remaining portion of the first appliance. The full bridge circuit is configured to generate, based on the second signal, an AC output during operation of the first appliance to cause induction heating of a target material.

In some embodiments an apparatus includes a direct-current (DC) source configured to supply a first DC output during operation of a first appliance. The DC source is configured to supply a second DC output during operation of a second appliance. The first DC output is different from the second DC output. The apparatus also includes a sensor configured to produce a measurement value indicating a property of a target material. The apparatus also includes a processor configured to generate a signal based on the measurement value. The apparatus also includes a full bridge circuit that is electrically coupled to the DC source. The full bridge circuit is configured to generate, based on the signal, a first AC output during operation of the first appliance to cause induction heating of the target material. The full bridge circuit is configured to generate, based on the signal, a second AC output during operation of the second appliance to cause induction heating of the target material. The first AC output is different from the second AC output.

In some embodiments, a method includes receiving a first measurement value from a sensor. The first measurement value is representative of a property of a conductive material. The conductive material is disposed on an appliance. The method also includes generating a signal based on a first difference between the first measurement value and a target value. The target value is input to the appliance. The method also includes switching a full bridge circuit to generate an alternating-current (AC) output based on the signal. The full bridge circuit is electrically coupled to a direct-current (DC) bus of the appliance. The DC bus is electrically coupled to a DC source. The method also includes applying the AC output to an induction coil to produce an alternating magnetic field. The alternating magnetic field inductively heats the conductive material. The alternating magnetic field is at least partially shielded by an electromagnetic interference (EMI) shield. The method also includes receiving a second measurement value from the sensor based on the alternating magnetic field. The second measurement value is representative of the property of the conductive material. A second difference between the second measurement value and the target value is less than the first difference.

BRIEF DESCRIPTION OF THE DRAWINGS

FIG. 5 shows a flow diagram of an example method for controlling output in an induction heating system, according to an embodiment.

DETAILED DESCRIPTION

The appliance system disclosed herein can address the challenges remaining with known systems by introducing a full bridge circuit that enables high power operation from a low-voltage DC source, such as a 115V battery while mitigating EMI. This can make appliance system suitable in, for example, portable, off-grid, and safety-sensitive applications where high-voltage AC power is impractical or dangerous. This can also make the appliance system suitable in applications where fixed sources (e.g., a branch circuit in a building) are not necessarily capable of providing peak power to operate the appliance. By using the full bridge circuit, the appliance system can achieve a peak-to-peak voltage across the induction coil that is double what a half-bridge system would provide under the same voltage, restoring power density and ensuring efficient cooking performance even in compact or mobile environments. The full bridge circuit can thereby substitute bulky transformers or step-up converters, simplifying the appliance system and reducing cost, weight, and complexity.

Beyond raw power delivery, the disclosed appliance system can additionally include features that enhance safety, usability, and regulatory compliance. For example, certain shielding structures can be included to address one of the major drawbacks of full bridge topologies, common-mode voltage-induced EMI, by intercepting capacitive coupling and significantly reducing emissions that could otherwise disrupt nearby devices or fail regulatory standards.

Figure 1:
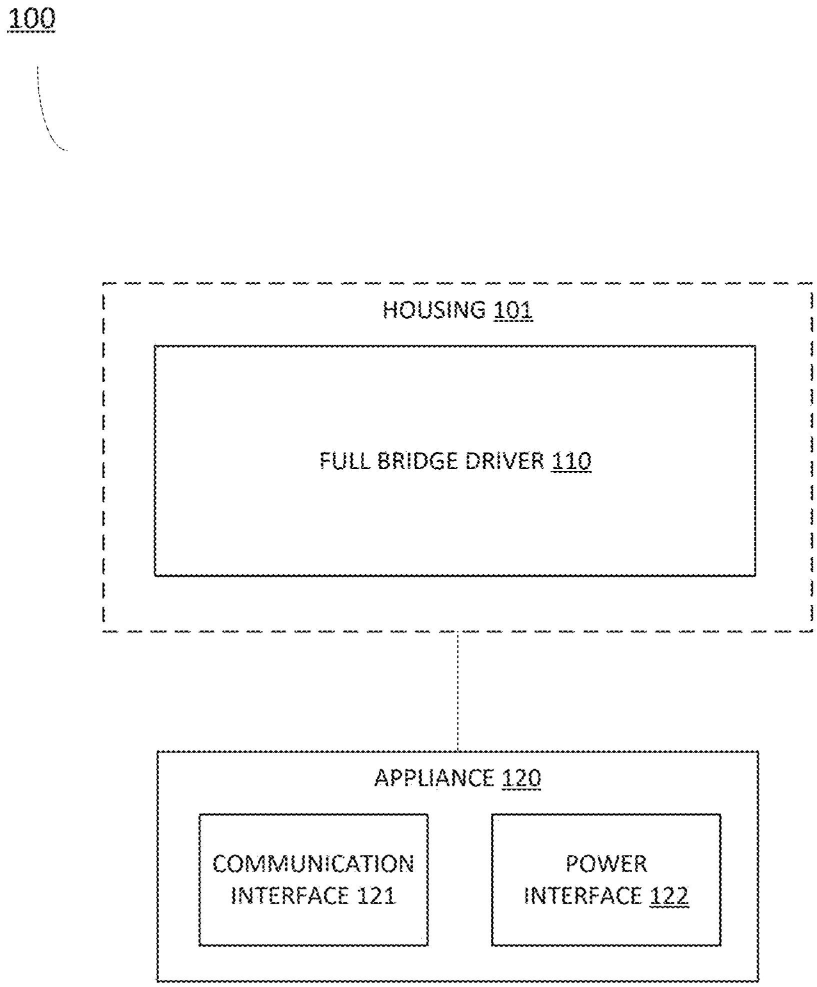
FIG. 1 shows a diagram of an appliance system, according to an embodiment.

FIG. 1 shows a diagram of an appliance system 100, according to an embodiment. The appliance system 100 can be configured to supply high power to appliances using a DC source. In one example implementation of the present disclosure, the appliance system 100 can be configured to inductively heat electrically conductive materials, such as metals. For example, the appliance system 100 can be configured to inductively heat ferrous metals like iron and steel (e.g., via magnetic hysteresis), as well as non-ferrous metals like copper, aluminum, brass, and various alloys (e.g., via induced eddy currents). In some instances, the appliance system 100 can be configured to inductively heat semiconductors, such as silicon carbide. In some instances, the appliance system 100 can be configured to inductively heat an intermediate material (e.g., a susceptor), which can be used to transfer heat to electrically non-conductive materials (e.g., glass, ceramics, plastics, etc.). As used herein, the material that is configured to be inductively heated by the appliance system 100 is referred to as a target material, as it is the recipient of electromagnetic energy generated by the appliance system 100. The appliance system 100 includes an optional housing 101, a full bridge driver 110, and an appliance 120.

The appliance 120 can be and/or include any suitable device designed for a specific function within a domestic, commercial, or industrial environment. The appliance 120 can be of an appliance type. The appliance type can be defined by shared characteristics among multiple appliances such as the function of the appliance 120, an amount of power consumed by the appliance 120, the environment in which the appliance 120 is deployed, the ability (e.g., communicative ability, etc.) of the appliance 120 to interface with other devices, and/or other suitable shared characteristics. The appliance 120 can be and/or include, for example, DC devices such as internal electronics, DC appliances, battery-powered devices, DC fast chargers, and/or AC appliances such as stoves, ovens, refrigerators, dishwashers, air conditioners, laundry machines, microwaves, etc. The appliance 120 can include ice makers, kegerators, wine coolers, beverage coolers, outdoor kitchens, outdoor pizza ovens, and/or the like. In implementations where the appliance 120 is a stove, for example, the appliance type can be described as a stove, a heating device, a kitchen appliance, and/or the like.

The appliance 120 can include electronic components (not shown) that can be configured to cause the full bridge driver 110 to support operation of the appliance 120. In one example implementation of the present disclosure, the appliance 120 can be configured to cause the full bridge driver 110 to inductively heat a target material. Electronic components can include, for example, a user interfacing element (e.g., a touchscreen, a knob, a button, a switch, a slider, a joystick, etc.) that can be interfaced with to produce a signal. A user can provide various inputs to the appliance 120 by interfacing with user interfacing element(s). The inputs can be used, for example, to configure parameters of the appliance system 100. Inputs can include, for example, a desired temperature of a target material, a desired time period during which a target material is inductively heated, a characterization of the type of target material, a characterization of an environment in which the appliance 120 is deployed, and/or other suitable inputs. Electronic components can also include, for example, one or more processor(s) that can be caused to coordinate signals along a communication bus (not shown) associated with the appliance 120. Processor(s) can receive signals from user interfacing element(s), process the signals, and send signals to the full bridge driver 110, via the communication interface 121 and when communicatively coupled to the full bridge driver 110. Electronic components can also include, for example, a display, a speaker, and/or other suitable elements that can be configured to provide feedback (e.g., such as performance and/or safety conditions of the appliance system 100) to the user. The electronic components can be coupled together by a DC bus and/or a communication bus within the appliance 120 (not shown).

The appliance 120 includes a power interface 122 and a communication interface 121. The power interface 122 can be an electrical connection point(s) that can receive power from the full bridge driver 110, for example, via a coupling to a power interface (not shown) of the full bridge driver 110. For example, the power interface 122 can include receptacles configured to receive an electrical plug that is connected to a power interface of the full bridge driver 110. The power interface 122 can be configured to supply DC power to drive a DC bus of the appliance 120. The communication interface 121 of the appliance 120 can be a communicative connection point(s) that can facilitate communications with other devices, such as the full bridge driver 110. The communication interface 121 can be coupled to a communication bus of the appliance 120 (not shown). For example, the communication interface 121 can be a control area network (CAN) connector, and the communication bus can send and/or receive CAN signals. In some implementations, the appliance 120 can be manufactured specifically to operate with the full bridge driver 110, or another driver with the same form factor and compatible electronics (not shown).

The full bridge driver 110 can be a portion of the appliance 120 that includes electronic components (e.g., a full bridge circuit, not shown in FIG. 1) configured to drive operation of the appliance 120. In one example implementation of the present disclosure, the full bridge driver 110 can be configured to drive induction heating of a target material (s) associated with the appliance 120. The full bridge driver 110 can be coupled to a remaining portion of the appliance 120 and not a remaining portion of another appliance (not shown) at the same time. The full bridge driver 110 can be configured to supply different AC output(s) based on specifications of the appliance that the full bridge driver 110 is coupled to. For example, an induction heating appliance (such as a stovetop) can have a different power requirement than a refrigerator. One instance of the full bridge driver 110 can be configured to supply one AC output to an induction heating appliance, and another instance of the full bridge driver 110 can be configured to supply another (different) AC output to a refrigerator.

As used herein, the term “different” (or “differing”) when referring to AC outputs and/or DC outputs (e.g., voltage, current, and/or power) denotes a functional distinction between values, and does not denote minor variations between values, which are often attributable to manufacturing tolerances or expected fluctuations in component performance. For example, two AC outputs having voltages of 120 V and 119 V, respectively, are not considered “different” as used herein. Two AC outputs having powers of 1,000 W and 2,000 W are considered “different” as used herein.

Instead, or in addition, two AC outputs can be considered "different" if one has a distinct voltage and current from the other, even if both result in substantially the same (e.g., within about 99%) power value. For example, two AC outputs having powers of about 1,000 W are considered "different" if one AC output has a voltage of 100 V and a current draw of 10 A, and the other AC output has a voltage of 200 V and a current draw of 5 A.

For example, induction heating appliances can have a varying amount of heating elements (e.g., induction coil(s)), which can at least partially define power ratings of those appliances. For example, one instance of the appliance 120 can be an induction stove (or another induction heating device) with one heating element (e.g., one induction coil), which can support induction heating of a single target material at a time. Another instance of the appliance 120 can be an induction stove (or another induction heating device) with multiple heating elements (e.g., multiple induction coils) that can be configured to simultaneously operate. The full bridge driver 110 can supply less AC output (e.g., less AC current, etc.) to the instance of the appliance with one heating element, and can supply more AC output (e.g., more AC current) to the other instance of the appliance with multiple heating elements.

Instead, or in addition, each instance of the appliance 120 can have predefined specifications/operational characteristics (e.g., stored in a memory; not shown in FIG. 1), which can indicate, for example, a power ceiling/power rating associated with that instance of the appliance 120, regardless of an amount of heating elements (or other components). For example, a processor of one instance of the appliance 120 (not shown in FIG. 1) can communicate the predefined specification to the full bridge driver 110 via the communication interface 121, which can cause the full bridge driver 110 to supply a particular AC output during operation of the appliance 120, while a processor of another instance of the appliance 120 can communicate a different predefined specification to the full bridge driver 110 to supply a different AC output during operation of the appliance 120. In these ways (or others), the full bridge driver 110 can be a "modular" component of the appliance system 100 that can have, for example, a single stock keeping unit (SKU) used in different instances of appliance 120 with different specifications. Such a single SKU component (such as the full bridge driver 110) can be used in multiple instances of appliance 120 with differing power specifications/usages; the processor of that instance of appliance 120 can provide a signal(s) to the single SKU component (e.g., full bridge driver 110) to adjust its performance/parameters consistent with (based on) the power specification/usages of the appliance 120. In other words, modularity of the full bridge driver 110 can be particularly useful in accommodating appliances with varying power ratings.

In some implementations, the housing 101 can enclose components of the full bridge driver 110 (not shown in FIG. 1). In some instances, the housing 101 can include one or more layers, which can serve various functions. For example, the housing 101 can include a conductive layer (or portion), such as a metal chassis, which can provide structural integrity to the full bridge driver 110 and absorb and/or reflect electromagnetic interference. Instead, or in addition, the housing 101 can include a transparent layer (or portion), such as glass, through which the components of the full bridge driver 110 can be made visible to a user without having to modify the housing 101. In some instances, the housing 101 can include one or more apertures or recesses (not shown in FIG. 1), which can provide access to connection points such as a power interface and/or a communication interface (not shown in FIG. 1). The housing 101 can be coupled to (or configured to be coupled to) a remaining portion of the appliance 120. In some instances, the housing 101 can be configured to be removably coupled to a remaining portion of the appliance 120. For example, the housing 101 can have an interface portion configured to complementarily fit with an interface portion of the appliance 120, as shown and discussed below with respect to FIGS. 4A-4B. In some implementations, the housing 101 can (instead, or in addition to enclosing components of the full bridge driver 110) enclose a remaining portion of the appliance 120, or otherwise be a housing of the appliance 120.

Figure 2:
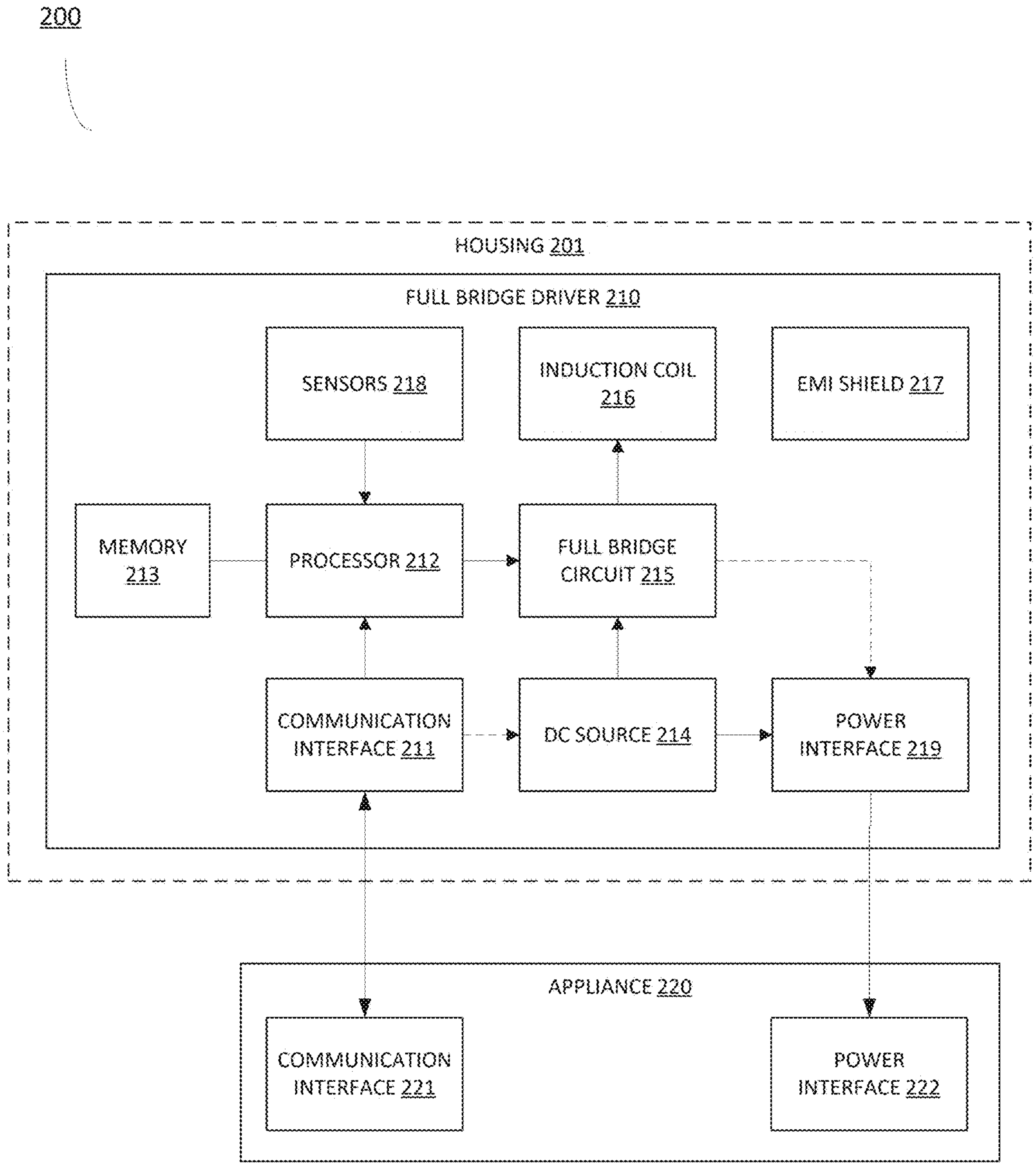
FIG. 2 shows a diagram of an induction heating system, according to another embodiment.

FIG. 2 shows a diagram of an induction heating system 200, according to an embodiment. The induction heating system 200 can be structurally and/or functionally similar to the appliance system 100 of FIG. 1 and represents an example implementation of the appliance system 100. The induction heating system 200 includes an optional housing 201 (e.g., structurally and/or functionally similar to the optional housing 101 of FIG. 1), an full bridge driver 210 (e.g., structurally and/or functionally similar to the full bridge driver 110 of FIG. 1), and an appliance 220 (e.g., structurally and/or functionally similar to the appliance 120 of FIG. 1). The full bridge driver 210 includes a communication interface 211, a processor 212, a memory 213, a DC source 214, a full bridge circuit 215, an induction coil 216, an EMI shield 217, sensors 218, and power interface 219. In some embodiments, a full bridge driver may not include the induction coil 216, in which case the full bridge driver and the appliance can collectively define a system that is not limited to induction heating. For example, the full bridge driver can be configured to supply power to a remaining portion of the appliance via the power interface, to support operation of the appliance.

The communication interface 211 can be a communicative connection point(s) that can send signals to a remaining portion of the appliance 220 and/or receive signals from a remaining portion of the appliance 220, or another device (not shown). As shown, the communication interface 211 can be communicatively coupled with the communication interface 221 of the appliance 220, and therefore also the communication bus of a remaining portion of the appliance 220. The communication interface 211 can send signals to and/or receive signals from the processor 212, via, for example, a communication bus (not shown) that is associated with the full bridge driver 210. In some instances, the communication bus of the full bridge driver 210 can be the communication bus of a remaining portion of the appliance 220.

The processor 212 can be a hardware-based integrated circuit (IC) and/or any other suitable processing device configured to run or execute a set of instructions and/or code stored, for example, in the memory 213. For example, the processor 212 can be a general-purpose processor, a central processing unit (CPU), an accelerated processing unit (APU), an application specific integrated circuit (ASIC), a network processor, a front-end processor, a field programmable gate array (FPGA), a programmable logic array (PLA), a neural processing unit (NPU), a graphics processing unit (GPU), and/or the like. The processor 212 can be in communication with the memory 213 via any suitable interconnection, system bus, circuit, and/or the like. The processor 212 can include any number of engines, processing units, cores, etc. configured to execute code, instructions, modules, processes, and/or functions associated with adjusting electrical parameters of the full bridge driver 210 such as, for example, gate voltage(s) of transistors that are included in the full bridge circuit 215. The processor 212 can be caused to adjust electrical parameters in response to receiving signals from a remaining portion of the appliance 220, or from the sensors 218. In some instances, the processor 212 can partially define a control (or feedback) loop, for example when some signals (e.g., signals from the appliance 220) are representative of a desired value (e.g., a "target" value) and some signals (e.g., signals from the sensors 218) are representative of a measurement value. The processor 212 can sporadically, periodically, or continuously adjust electrical parameters of the induction heating system 200 while a measurement value of the sensors 218 is not substantially equal (e.g., within 99%, 98%, 95%, etc.) to the desired value indicated by or associated with the appliance 220. For example, the processor 212 can identify a difference between a measurement value and a desired value and can generate a signal using pulse width modulation and/or frequency modulation techniques to drive switching elements of the full bridge circuit 215 to decrease the difference, thereby regulating current across the induction coil 216.

In addition to power regulation, the processor 212 can also manage real-time target material detection. By analyzing changes to an electromagnetic parameter (e.g., a reflected impedance signals, a current value, an inductance, etc.) of the induction coil 216, the processor 212 can determine whether a target material is present, what its size is, and/or what material it is made of. The processor 212 can calculate the magnetic force exerted on the target material based on the changes to the electromagnetic parameter of the induction coil 216 and can automatically tune power output in response to the magnetic force approaching, meeting, or surpassing a force value keeping the target material on the appliance 220. The processor 212 can thereby prevent such dangerous conditions. In some implementations, the processor 212 can analyze a rate of change in a pressure signal to determine that a target material could be moving (e.g., vibrating, shaking, or even levitating). For example, a small rate of change could indicate a nominal operation of the induction heating system, while a large rate of change could indicate that the target material has been removed from a surface of the appliance 220 or is moving due to Lorentz forces overcoming forces that keep the cookware unit in place.

In some implementations, the full bridge driver 210 can be configured to store (e.g., in the memory 213) or otherwise access a machine learning model. The machine learning model can include, for example, a supervised machine learning model and/or an unsupervised machine learning model. The machine learning model can include, for example, a convolutional neural network (CNN), a recurrent neural network (RNN) and/or any neural network or other suitable machine learning model. The machine learning model can include, for example, an end-to-end machine learning model. The end-to-end machine learning model can learn the steps between an initial input phase (e.g., data from the sensors 218, input from a user) and an output result (e.g., characteristics associated with a target material, components of the full bridge driver 210, and/or the appliance 220). The machine learning model can be trained to, for example, predict characteristics of a target material (e.g., a type of cookware unit, the type of food being cooked in the cookware unit, etc.). The processor 212 can be caused to deploy the machine learning model 124 during operation of the full bridge driver 210 and the appliance 220.

Furthermore, the processor 212 can implement an EMI mitigation strategy. The processor 212 can coordinate layered frequency modulation schemes and synchronize operation with shielding mechanisms to minimize electromagnetic emissions. This dynamic management can enable the induction heating system 200 to meet strict FCC and CISPR EMI standards while avoiding the need for bulky filters, thus keeping the unit compact, quiet, and energy efficient. If abnormal EMI conditions are detected, such as unusual switching transients due to poor target material contact, the induction heating system 200 can dynamically adjust electrical parameters of the full bridge circuit 215 such as, for example, the pulse width modulation (PWM) duty cycle or modulation profile, limit inverter voltage or coil current, and temporarily switch to safer operating modes. This adds a real-time adaptive layer of EMI control, ensuring robustness even in less-than-ideal scenarios.

The memory 213 can be, for example, a stack memory, a random-access memory (RAM), a memory buffer, a magnetic disk (e.g., hard drive memory), a read-only memory (ROM), an erasable programmable read-only memory (EPROM), a flash memory, and/or the like. The memory 213 can be configured to store, for example, one or more software modules and/or code that can include instructions that can cause the processor 212 to perform one or more processes, functions, and/or the like, as discussed above.

In some implementations, the processor 212 and the memory 213 can be included in a printed circuit board. The printed circuit board that includes the memory 213 and the processor 212 is also referred to herein as a heating element board (HEB). The HEB can be configured to execute and coordinate a wide array of functions that can ensure the induction heating system 200 operates efficiently, safely, and within electromagnetic compliance limits. The HEB can include integrated circuits (ICs), such as, for example, microcontrollers, gate drivers, analog front ends, and power management units. In some instances, the HEB can be positioned at a base of the housing 201.

The power interface 219 can be an electrical connection point(s) that can send power to a remaining portion of the appliance 220. For example, the power interface 219 can include receptacles configured to receive an electrical plug that is connected to the power interface 222 of the appliance 220. The power interface 219 can receive direct-current (DC) power from the DC source 214, via, for example, a DC bus (not shown) associated with the full bridge driver 210.

The DC source 214 can be any suitable source capable of storing and providing DC energy. For example, the DC source 214 can be and/or include a battery with battery terminals, a regulated power supply, a photovoltaic (PV) cell(s), fuel cells (e.g., hydrogen fuel cells or other renewable fuels), and/or the like. As discussed above with respect to the full bridge driver 110 of FIG. 1, the DC source 214 can be electrically coupled to the DC bus of the appliance 220, for example via a connection between the power interface 219 and the power interface 222. The DC source 214 can also be electrically coupled to the full bridge circuit 215. In some implementations, the DC source 214 can be (or can be configured to be) electrically, removably coupled to the DC bus of the appliance 220. For example, the DC source 214 can be removed and replaced while the appliance 220 remains on and operational (also referred to herein as being "hot-swappable").

The DC source 214 can be configured to operate (e.g., supply DC output) sporadically, periodically, or continuously in support of operation of the appliance 220, and/or of the full bridge circuit 215. The DC source 214 can supply DC output to switching elements of the full bridge circuit 215, which can at least partially define AC output that the full bridge circuit 215 can produce (e.g., peak-to-peak voltage of the AC output). For example, in some implementations, the DC source 214 can be configured to supply a DC output to the full bridge circuit 215 with a voltage between about 110 V and about 130 V, which can drive the full bridge circuit 215 to produce AC output with a peak-to-peak voltage between about 220 V and about 260 V. The DC source 214 can be configured to supply different amounts of DC output to the full bridge circuit 215 based on properties of the appliance 220 (or another appliance; not shown), as described with respect to FIG. 1. In some implementations, the DC source 214 can supply DC output to electronic components (not shown) of the appliance 220.

In some implementations, the DC source 214 can be configured to receive signals from and/or send signals to a remaining portion of the appliance 220 via the communication interface 211. For example, the DC source 214 can be and/or include a battery management system that includes one or more battery cells (e.g., 2 cells, 8 cells, 16 cells, 32 cells, etc.), sensors (e.g., a thermal sensor, etc.), a processor, a memory, a communication interface, fuses, circuit breaker(s), safety circuits, and/or the like (not shown in FIG. 2). The battery management system can be configured to manage charging and discharging of the battery cell(s) to ensure safe performance. The communication interface (not shown in FIG. 2) of the DC source 214 can be configured to couple to the communication bus (not shown in FIG. 2) that is associated with the full bridge driver 210. The processor and the memory (e.g., firmware; not shown in FIG. 2) of the DC source 214 can be configured to generate signals to send to a remaining portion of the appliance 220 and/or to respond to signals sent by a remaining portion of the appliance 220. In one example, the processor of the DC source 214 can be caused to generate signals that represent parameters and/or a state of the DC source 214 (e.g., a charge state, a charge capacity, a temperature value, etc.). Instead, or in addition, the processor of the DC source 214 can be caused to respond to signals that represent information (e.g., a power rating of the appliance 220, a maximum charge level of the DC source 214) and/or commands (e.g., a command to not discharge more power than the appliance 220 can safely handle, a command to not surpass a maximum charge level, a command to adjust thermal controls such as activating a fan or other cooling system prior to a large power draw, etc.).

For instance, a remaining portion of the appliance 220 can be caused to send signals to the DC source 214 when provisioning the DC source 214 to support operation of the appliance 220. For example, the provisioning of the DC source 214 can be performed the first time that the appliance 220 is powered on or alternatively every time that the appliance 220 is powered on. The signals can represent predefined specifications of the appliance 220, such as a power rating of the appliance 220 (e.g., a maximum amount of power that the appliance 220 can draw). As described with respect to FIG. 1, different instances of the appliance 220 can have different power ratings. A first instance of the appliance 220 can be caused to send, to a first instance of the DC source 214, a signal that represents a power rating of that first instance of the appliance 220. Meanwhile, a second instance of the appliance 220 can be caused to send, to a second instance of the DC source 214, a signal that represents a power rating of that second instance of the appliance 220. Each instance of the DC source 214 can respond, respectively, to each signal, and can limit the power supplied to each instance of the appliance 220 accordingly. Notwithstanding the inclusion in different appliances and receiving different provisioning signals, each instance DC source can be essentially the same implementation (e.g., having a common SKU).

The memory of the DC source 214 can store data that represents expected (e.g., predefined by a manufacturer and/or user) and/or measured (e.g., using sensors) characteristics of the DC source 214, such as a temperature value, a range of safe temperature values, a voltage value, a range of safe voltage levels, a current value, a range of safe current levels, a charge capacity, a charge level, and/or the like. The processor of the DC source 214 can be caused to modify parameters of the DC source 214 based on differences between the expected and the measured characteristics. The processor of the DC source 214 can be caused to analyze the measured characteristics over different time periods to establish an operational "history". The processor of the DC source 214 can be caused to determine and/or predict information about the DC source 214 based on the operational history, such as an (improved) prediction for a state of health, a state of charge, failure indicators (e.g., short circuits, abnormal heating, etc.), or configuration (e.g., a configuration that is improved or optimized for a specific environment or a type of user).

The full bridge circuit 215 can be a full bridge inverter circuit configured to invert a DC output to produce an AC output. The full bridge circuit 215 can include controllable switching elements arranged in a bridge topology (e.g., an H bridge). The switching elements can include, for example, metal-oxide-semiconductor field effect transistors (MOSFET), insulated-gate bipolar transistors (IGBT), or any other suitable transistor or semiconductor device capable of high-speed switching. The switching elements can be arranged in two pairs, with each pair connected in series between a voltage rail (e.g., coupled to the DC source 214) and a reference voltage rail (e.g., coupled to a ground, such as earth ground). In some implementations, such as when the DC source 214 is configured to be a battery, for example, each pair of switching elements can be connected in series between one terminal of the DC source 214 and a second terminal of the DC source 214. The electrical path that extends from one switching element to the second switching element of a first pair (e.g., the electrical connection between a source of one MOSFET and a drain of a second MOSFET in a pair of MOSFETs; also referred to herein as an output node) can be connected to a first end of the induction coil 216. An output node of the second pair can be connected to a second end of the induction coil 216. By selectively activating the switching elements in a complementary fashion (e.g., a first switching element of a first switching pair and a second switching element of a second pair during a same time period), the full bridge circuit 215 can produce a bipolar AC voltage (also referred to herein as AC output) across the induction coil 216. The AC output can have a high frequency, for example between about 20 kHz and about 100 kHz. In some implementations, the switching elements can be driven by a signal (e.g., a PWM signal) or other modulated signal (e.g., a spread spectrum signal) to adjust electrical characteristics of the AC output (e.g., a current, a frequency, etc.). The signal can be provided by, for example, the processor 212. The signal can be representative of a frequency that at least partially defines the switching frequency of the switching elements (e.g., substantially equal to, or a factor thereof).

The induction coil 216 can be a conductor defining at least one loop(s) and configured to generate an alternating (e.g., time-varying) magnetic field in response to receiving an AC output. The induction coil 216 can include various conductive materials (e.g., copper, aluminum, "Litz" wire, etc.) and insulating materials (e.g., polymeric insulators such as enamel coating, etc.) located between adjacent portions of the conductive material(s) to prevent shorting between each turn of a loop. The induction coil 216 can be arranged according to various geometries and configurations, such as a substantially planar spiral shape (e.g., for domestic applications such as in induction cooking; for reducing skin effect losses/improving a peak strength of the generated magnetic field), a substantially volumetric (e.g., cylindrical) shape (e.g., for high power applications; boosting magnetic field density), a segmented configuration defined by segments (or zones) that can have a shape and/or size defined by a shape and/or size of the target material, and/or a booster configuration (e.g., for delivering short bursts of high energy). In all configurations and/or shapes, the induction coil 216 can include insulating materials between adjacent portions of the conductive material(s) to prevent shorting between each portion of the conductive material. The induction coil 216 can be configured to carry high-frequency AC output, which can improve efficiency of energy transfer from the AC current to the alternating magnetic field. While shown as being in the full bridge driver 210, it is to be understood that the induction coil 216 is a heating element associated with the appliance 220, and that the full bridge driver 210 itself is a portion of the appliance 220. While shown in FIG. 2 as a single induction coil 216, in some embodiments, the induction heating system 200 of the present disclosure can include multiple induction coils (or other heating elements) associated with the appliance 220 (or another appliance), full bridge driver 210

High frequency switching elements in the full bridge circuit 215 can cause large common-mode voltage swings, which can capacitively couple to conductors other than the target material. This coupling can generate high-frequency EMI that can radiate or conduct into the surrounding environment, which can interfere with nearby devices. The EMI shield 217 can be a conductive material (e.g., copper, aluminum, etc.) configured to intercept and suppress common-mode capacitive coupling, thereby reducing high-frequency EMI. In this way, the EMI shield 217 can at least partially shield the alternating magnetic field, without degrading the energy transfer between the alternating magnetic field and the target material. The EMI shield 217 can be disposed between the induction coil 216 and the target material. In some instances, the EMI shield 217 can be referenced to a stable ground via a ground path, allowing displaced charge to return safely instead of radiating. The EMI shield 217 can reduce the EMI signature of the induction heating system 200 significantly, even before applying known filters. The EMI shield 217 can thereby enable the induction heating system 200 to remain compliant with FCC and CISPR EMI standards without requiring bulky external filters or enclosures, making it desirable in, for example, compact or mobile applications.

The EMI shield 217 can be configured to shield EMI without preventing thermal airflow. For example, the EMI shield 217 can have portions (e.g., portions of conductive material), which can be separated by apertures. The apertures can permit heat to pass from a side of the EMI shield 217 (e.g., from an under side of the EMI shield 217) and through an opposite side of the EMI shield 217 (e.g., from an upper side of the EMI shield 217). In addition, the composition and/or shape of the portions of EMI shield 217 can serve to redistribute and dissipate the heat generated during induction heating. In some implementations, the EMI shield 217 can include elongated portions that are positioned circumferentially about a center location of the EMI shield 217. An elongated portion can be a portion that has a length in a radial direction that is greater than a width in a circumferential direction. The portions can be removably coupled together or monolithically formed together. For example, each elongated portion can have an end that is connected to a ring portion of the EMI shield 217, and a second end that extends from the ring portion. The ring portion can define a circumference of the EMI shield 217.

The sensors 218 can be and/or include a thermal sensor, a presence sensor, a current sensor, a voltage sensor, and/or another suitable sensor(s) configured to monitor parameters (or properties) of the induction heating system 200. For example, the sensors 218 can be configured to detect electromagnetic properties of the induction coil 216 (e.g., a current value, a phase shift, an impedance value, etc.), and/or thermal properties of a target material (e.g., a temperature value). The sensors 218 can be configured to provide real-time data to the processor 212 to cause the processor 212 to adjust electrical inputs to the full bridge circuit 215.

Thermal sensors can be configured to detect a temperature, heat flow rate, or other suitable thermal values of the induction coil 216 and/or of a target material. Thermal sensors can include, for example, temperature-sensitive resistors (e.g., thermistors such negative temperature coefficient (NTC) thermistors, etc.), heat flux sensors (e.g., resistive temperature detectors (RTD), thermocouples, etc.), or digital temperature ICs. In implementations where the thermal sensors are configured to detect thermal properties of both the induction coil 216 and of the target material, the thermal sensors can be disposed close to both the induction coil 216 and a target material. For example, thermal sensors can be disposed between the induction coil 216 and the target material. Thermal sensors can send thermal measurements (e.g., a temperature value, a heat flux value, a thermal resistance value, etc.) to the processor 212. In response to receiving thermal measurement values from thermal sensors, the processor 212 can be configured to regulate power applied to the induction coil 216, maintain a consistent inductive heating temperature of a target material, and/or implement safety features such as overheating protection and automatic shut-off. In some instances, thermal sensors can also be configured to measure temperature value(s) of other components of the full bridge driver 210, such as the switching elements of the full bridge circuit 215, or other electronic components. The processor 212 can thereby be caused to activate thermal throttling or shutdown mechanisms when limits are approached, ensuring long-term reliability.

Presence sensor(s) can be configured to detect whether a target material is nearby (e.g., contacts, etc.) a portion of the appliance 220, such as a surface of the appliance 220. Presence sensor(s) can include, for example, capacitive sensors, which can be configured to detect a presence of target material on a portion of the appliance 220. Presence sensor(s) can also include, for example, load cell sensor(s), which can be configured to detect a mechanical force value (e.g., a mass value, a pressure value, etc.) of a target material disposed on the load cell sensor. Presence sensor(s) can also include, for example, magnetic sensors (e.g., Hall effect sensors), which can be configured to detect electromagnetic characteristics of a (ferrous) target material. Presence sensor(s) can also include, for example, frequency detectors, which can be configured to detect a change to an electromagnetic property (e.g., an inductance, a phase shift, an impedance value, etc.) of the induction coil 216 when the induction coil 216 electromagnetically couples to a target material (e.g., during induction heating). In some implementations, the induction heating system 200 can be configured to activate (e.g., initiate processes to inductively heat a target material) in response to a presence sensor(s) detecting a presence of a target material. The induction heating system 200 can thereby reduce energy waste and prevent accidental heating of an empty zone, which can damage the cooktop or pose a safety risk.

Voltage sensor(s) and current sensor(s) can be configured to measure electrical characteristics of the induction heating system 200, such as, for example, a gate voltage of a switching element of the full bridge circuit 215, a voltage potential across the induction coil 216, a current through the induction coil 216, a voltage potential of a DC bus, and/or the like. Voltage sensor(s) can include, for example, a voltage divider, an isolated amplifier, and/or the like. Current sensor(s) can include, for example, a current sensor IC, and/or the like. The sensors 218 can provide, for example, for the induction heating system 200 to accurately regulate power delivery, switching frequency, and/or efficiency. The sensors 218 can facilitate the processor 212 in maintaining stable power output and protecting the induction heating system 200 from overcurrent or overvoltage events.

In some implementations, the processor 212 can be caused to adjust parameters (e.g., operational parameters) of the induction heating system 200 based on properties of the target material, such as a size, weight, shape, or type of the target material. The sensors 218 can be configured to measure the properties of the target material (e.g., directly measure via load cell sensor(s), or indirectly measure via frequency detectors), and send a signal that is representative of the material properties to the processor 212. In this way, the induction heating system 200 can more precisely tune a power output from the induction coil 216 to improve induction heating performance and efficiency. For example, the induction heating system 200 can be caused to send less power output to a small (or lighter) target material and more power output to a large (or heavier) target material. Such control can be useful, for example, in preventing a small (or lightweight) target material from shifting, vibrating, or even lifting off the appliance 220 in response to excessive magnetic forces. Instead, or in addition, the induction heating system 200 can be caused to provide power output to a ferrous target material that is different from a power output to a non-ferrous target material.

In some implementations, the sensors 218 can be included in a printed circuit board. In some instances, the sensors 218 can be included in a heating element board, which includes electronic components such as the memory 213 and the processor 212. On the HEB, sensor signals from the sensors 218 can be routed to the processor 212, where the sensor signals can be for example conditioned, digitized, and processed. This localized approach to sensing can improve response time and reduce susceptibility to noise, which is desirable in the high-EMI environment beneath the induction coil 216. Additionally, local processing simplifies wiring and reduces the need for complex inter-board signal routing, enhancing the modularity and maintainability of the overall system.

In some implementations, the full bridge driver 110 can include other components configured to support operation of the appliance 220. In some instances, the appliance 220 can be an induction stove, and the housing 201 can have an interface portion that can complementarily fit with an interface portion of the induction stove. The housing 201 can be disposed between the appliance 220 and the target material (e.g., a cookware unit such as a pan, a pot, etc.). The components of the full bridge driver 210 can be arranged in the housing 201 to provide protection against heat and EMI while the appliance 220 is in operation. For example, the housing 201 can include an electrically insulating layer(s) (not shown) disposed between the EMI shield 217 and the target material, a thermally insulating layer(s) (not shown) disposed between the EMI shield 217 and the induction coil 216, a ferrous material layer(s) (not shown) disposed between the induction coil 216 and the processor 212, and/or a second EMI shield(s) (not shown) disposed between the induction coil 216 and the processor 212.

In some implementations, the electrically insulating layer (also referred to herein as the top ceramic or glass cooktop layer; not shown) can be an interface between the induction heating system 200 and the user's cookware. The electrically insulating layer can be made of any suitable material with high thermal stability, high mechanical strength, and/or low thermal expansion such as, for example, silicates, sheet silicates (e.g., mica, etc.), and/or specialized glass-ceramic materials, such as SCHOTT CERAN®. These materials can endure rapid heating and cooling cycles without cracking. Electrically, the glass cooktop layer can be insulating, which ensures that no current flows into the user's cookware or the user themselves, thus contributing to the overall safety of the induction heating system 200. The glass cooktop layer can also be magnetically transparent, meaning it allows the alternating magnetic fields generated by the (underlying) induction coil 216 to pass through with minimal attenuation. This can provide efficient power transfer to the cookware unit placed on the insulating layer.

While the induction coil 216 itself does not get as hot as known heating elements (e.g., gas burners, etc.), it can produce waste heat through resistive losses and magnetic hysteresis. In some implementations, the thermally insulating layer (also referred to herein as a heat shield; not shown) can be configured to absorb and dissipate heat, preventing hotspots and protecting the full bridge driver 210 from thermal stress. The heat shield can passively exchange heat and/or actively exchange heat. For example, the heat shield can be and/or include a heat sink. In some instances, the heat shield can be and/or include a vapor chamber, which can in some cases spread heat more efficiently than solid metal structures. The vapor chamber can contain a working fluid (e.g., water) and a wick structure within a sealed chamber. In some instances, the heat shield can include a working coolant (e.g., liquids) within a coolant chamber(s) (e.g., a tubular chamber(s)). In some instances, the heat shield can include metallic and dielectric materials, for example arranged in a stacked or laminated configuration to optimize (or improve) performance in both domains. In some instances, the heat shield can include thermal spreaders or shields, which can include, for example, a mica sheet (e.g., mica glass), and can be shaped with radial fins or perforations. The composition and/or shape of the thermal spreaders can serve to redistribute and dissipate the heat generated during induction heating.

In some implementations, the ferrous material layer (not shown) can be configured to provide a low-reluctance path for magnetic flux associated with the rapidly alternating magnetic field that extends upward through the glass cooktop layer. The ferrous material layer can thereby improve the power transfer efficiency between the induction coil and ferromagnetic cookware placed on the glass cooktop layer. The ferrous material layer can include any material with a higher magnetic permeability than surrounding air such as, for example, ferrite material, ferrite cores, ferrite magnets, and/or the like.

In some implementations, the second EMI shield (not shown) can be configured to shield EMI that otherwise might interfere with the processor 212, or other electronic components of the induction heating system 200. The second EMI shield can act as a common return path for electrical currents and help reduce noise coupling and voltage transients throughout the full bridge driver 210. The second EMIs shield can either passively reflect and absorb unwanted emissions or actively work in conjunction with other shield layers to contain radiated and conducted electromagnetic interference. Additionally, the second EMI shield can act as a heat sink, especially for components mounted in direct contact with it, such as those included in the full bridge circuit 215. In such cases, thermal interface materials can be used to ensure good thermal conductivity between the component and the frame. This then allows heat to be spread and dissipated across a larger surface area, reducing hotspots and prolonging component life.

In some implementations, any of the components within the full bridge driver 210 can be outside of the housing 201 and instead can be within other housing(s) (not shown), and/or in the appliance 220. The components of the full bridge driver 210 that are outside of the housing 201 and that are configured to be within the appliance 220 can be removably coupled with each other and/or with remaining components of the full bridge driver 210 that are within the housing 201. Similarly, the components of the full bridge driver 210 that are outside of the housing 201 and that are configured to be within multiple different housings in addition to the housing 201 can be removably coupled with each other. For example, in some instances, the DC source 214 can be in a first housing, and the communication interface 211, the power interface 219, the processor 212, the induction coil 216, the EMI shield 217, and the sensors 218 can be in a second housing. Furthermore, the first housing and the second housing can be removably coupled with each other and can collectively be removably coupled with the appliance 220. Instead, or in addition, in some instances, there can be one or more other full bridge circuits (not shown) and/or one or more other DC sources (not shown). The one or more other DC sources can each be enclosed by a different housing, while the full bridge circuits each may not be enclosed by a full-bridge-circuit specific housing so that thermal airflow to the full bridge circuits via cooling system(s) can be facilitated as appropriate for example by each appliance model or type. In some embodiments, the housings enclosing the DC sources (or interfaces to DC sources) can be removably coupled together with the housing 201 and can collectively be removably coupled with the appliance 220. Each instance of a housing 201 that encloses a component of the full bridge driver 210 can be certified (or in some cases, separately certified) to meet known standards (e.g., safety, performance, energy efficiency, electromagnetic compatibility, etc.) associated with operating the appliance 220. For example, known standards can include Underwriters Laboratories (UL), International Electrotechnical Commission (IEC), International Organization for Standardization (ISO), and National Sanitation Foundation (NSF).

Figure 3:
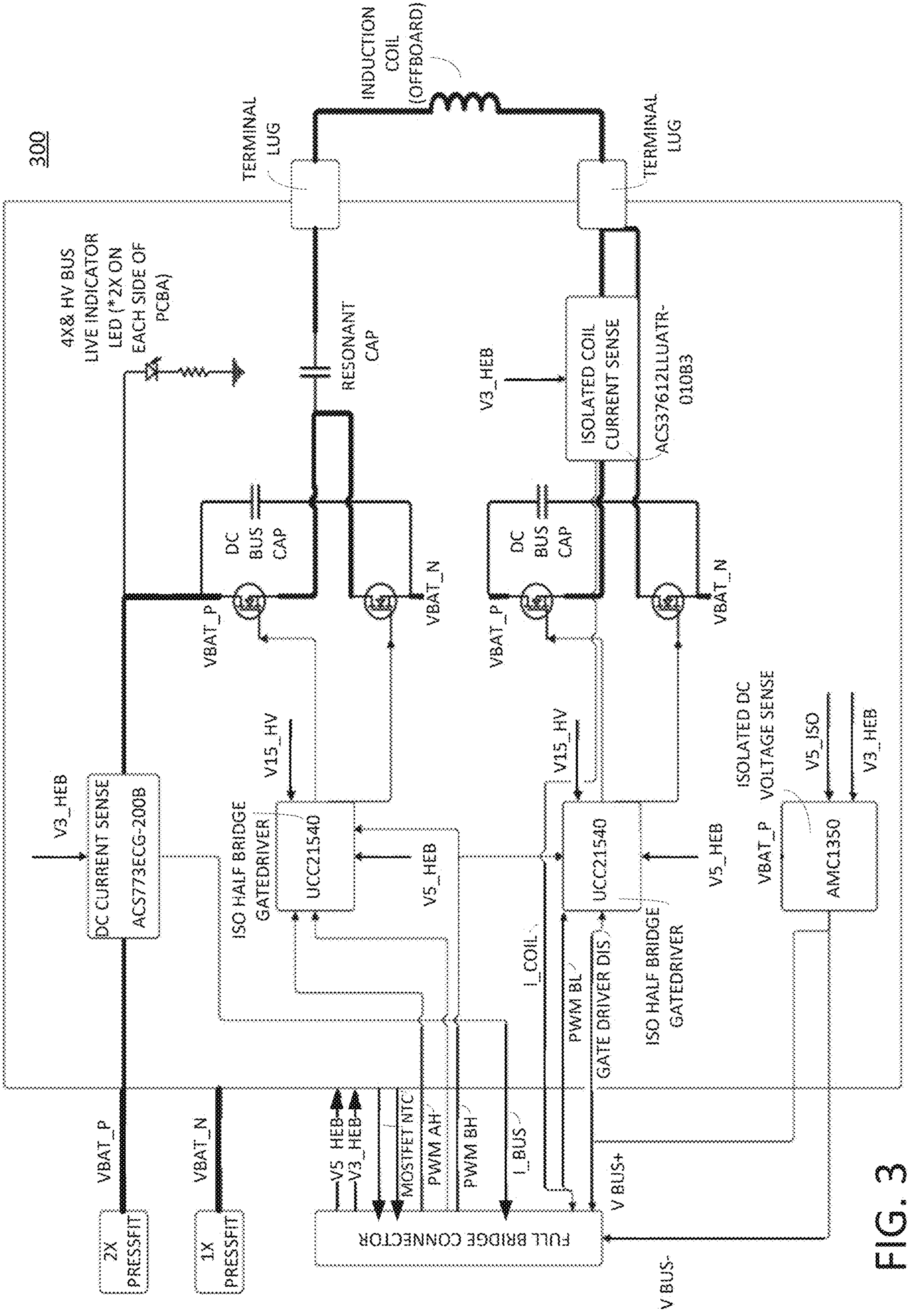
FIG. 3 shows a diagram of an example full bridge circuit, according to yet another embodiment.

FIG. 3 shows a diagram of an example full bridge circuit 300, according to an embodiment. The full bridge circuit 300 can be structurally and/or functionally similar to the full bridge driver 110 of FIG. 1 and/or the full bridge circuit 215 of FIG. 2. The full bridge circuit 300 can be a power inverter circuit that converts low-voltage DC input (e.g., 115 V from a battery pack) into high-frequency (e.g., within a range of 20 kHz to 100 kHz) AC output. The full bridge circuit 300 can be configured to efficiently switch large amounts of power (e.g., up to 10 KW) while minimizing losses and maintaining control over electromagnetic behavior. The full bridge circuit 300 includes a full bridge connector, isolated gate driver(s), a current sensor for the DC bus, a current sensor for an induction coil (e.g., the induction coil 216 of FIG. 2), a voltage sensor for the DC bus, power transistors, and terminal lugs that can couple to a load, such as the induction coil depicted in FIG. 3. In some embodiments, the load can be a component of an appliance, such as a power bus (e.g., an AC bus) configured to support operation of the appliance.

The full bridge connector can be any suitable hardware connector such as, for example, a header/pin connector that can couple the full bridge circuit 300 to other sub-systems of an appliance system (e.g., the appliance system 100 of FIG. 1 and/or the induction heating system 200 of FIG. 2). The full bridge connector can be configured to receive signals from the current sensors and/or voltage sensors and send the signals to a processor (e.g., the processor 212 of FIG. 2). As discussed with respect to the sensors 218 of FIG. 2, such signals can indicate, for example, a voltage/current value of the DC bus, a current value of the induction coil, and/or any other signals that can represent feedback from the components of the full bridge circuit 300. The full bridge connector can be configured to receive signals from the processor and send signals to the isolated gate driver(s). As discussed with respect to the processor 212 of FIG. 2, such signals can be, for example, pulse width modulation (PWM) signals that can cause the isolated gate driver(s) to control switching of the power transistors. The full bridge connector can also be configured to supply voltage rails to components of the full bridge circuit 300 such as, for example, a 3V rail and/or a 5V rail.

The isolated gate driver(s) can be half-bridge gate driver(s) such as the Texas Instruments® UCC21540 or another gate driver (not shown in FIG. 2). The isolated gate driver(s) can be configured to switch the power transistors at high frequencies (e.g., in a range of 20 kHz to 100 kHz) based on the PWM signals input to the isolated gate driver(s). To mitigate the strong harmonics that accompany fixed-frequency switching, the isolated gate driver(s) can use variable-frequency switching. In some implementations, the isolated gate driver(s) can feature spread spectrum frequency modulation. For example, the isolated gate driver(s) can modulate the PWM signal with a frequency-varying carrier wave (e.g., a sinusoidal wave, a rectangular wave, a triangular wave, etc.) to produce spread spectrum PWM signal that can be applied to the gates of the power transistors. A capacitor bank can be electrically coupled between the DC input and the power transistors and can stabilize the input voltage and help buffer the sudden current demands when the power transistors switch at high frequencies.

The isolated gate drivers can ensure that the control signals are electrically separated from the power transistors, preserving system integrity in the event of faults or voltage surges. The isolated gate driver(s) can implement galvanic isolation between its low-voltage input and high-voltage output pins. In the illustrated embodiment, the half-bridge gate driver can have isolated gate driving, dual channel output, high drive capacity, dual-time control, and under-voltage lockout (UVLO). The example UCC21540 can provide isolation up to 5 kVrms using capacitive isolation technology. This can prevent high voltage from transferring back to the control side, ensuring user and system safety. In addition, the half-bridge gate driver can drive two gate terminals: one for the high-side switch and one for the low-side switch of a half-bridge leg. In the full bridge circuit 300 shown in FIG. 3, two UCC21540 ICs can be used, one for each half-bridge pair. Under certain circumstances, the isolated half-bridge gate driver(s) can be capable of sourcing and sinking up to 4 A of current and thus ensure fast and clean switching of the power transistors, reducing losses and EMI. Moreover, the dead-time control can help prevent cross-conduction, where both switches in a leg are on simultaneously, which can cause a short circuit across the DC bus. The UVLO can also help protect the system by ensuring that neither side turns on unless there is sufficient voltage to drive the gates fully, avoiding partial switching that causes overheating.

In some implementations, the isolated gate driver(s) can use a spectral spreading technique (e.g., spread spectrum frequency modulation), modulating the switching frequency in a controlled pattern that varies slightly over time. This has two effects. First, it spreads the energy of EMI emissions associated with the appliance system over a broader frequency band, reducing the amplitude of emissions in any single frequency sub-band. Second, it makes the appliance system less prone to violating narrowband EMI limits, improving compliance with standards like federal communications commission (FCC) or comité international spécial des perturbations radioélectriques (CISPR). Unlike fixed-frequency designs that generate strong harmonic peaks, this method can soften the EMI profile of the appliance system, helping the system pass regulatory tests without the need for oversized EMI filters.

The power transistors can be metal-oxide-semiconductor field-effect transistors (MOSFETs) or insulated gate bipolar transistors (IGBTs) arranged in two pairs, with each pair forming a half-bridge or leg of the full bridge circuit 300. As shown in FIG. 3, the power transistors can be, for example, a set of four n-channel (complementary) metal oxide semiconductive FETs. The power transistors can be controlled using the PWM signals that are precisely timed and alternated to create a bipolar voltage across the load (e.g., the induction coil shown in FIG. 3). By applying the PWM signals to the gates of the power transistors, the full bridge circuit 300 can generate an alternating current in the load.

The induction coil can be configured to be coupled to the full bridge circuit 300 via, for example, the terminal lugs. The induction coil can be included within a resonant LC circuit that also includes resonant capacitor(s). This resonant LC circuit can set the operating frequency of the full bridge circuit 300 and can be tuned to achieve maximum efficiency during power transfer. The induction coil can transfer energy to the target material via the generated magnetic field. This energy is converted into heat by eddy currents and magnetic losses in the target material's base. The full bridge circuit 300 can include current sensors to monitor both the input and output stages, enabling real-time feedback for power regulation, safety protection, and adaptive control such as cookware levitation suppression. The full bridge circuit 300 can also include auxiliary circuits to handle the generation of lower voltage rails for logic and sensors, thermal monitoring of the power transistors, and visual indicators to alert users when high voltage is present, etc.

The DC current sensor can monitor the DC bus current that flows into the full bridge circuit 300. The DC current sensor can enable power regulation such as adjusting the output based on the input current draw, system protection such as detecting overcurrent conditions or faults, and efficiency monitoring to ensure energy is being used optimally. As shown in FIG. 3, the DC current sensor can be, for example, Allegro Microsystems® ACS773, which is a high-precision, Hall-effect-based DC current sensor. The DC current sensor can provide galvanically isolated measurements of high DC (and AC) currents with high accuracy and low power loss, making it particularly suitable for applications like power inverters, battery systems, and appliance systems like an induction heating system.

The isolated DC voltage sensor can be any suitable isolated DC voltage sensor configured specifically for high-voltage DC voltage sensing in systems that use galvanic isolation between the measurements and control circuits. As shown in FIG. 3, the isolated DC voltage sensor can be, for example, Texas Instruments® AMC1350. The isolated DC voltage sensor can facilitate safely and accurately sensing the DC bus voltage that powers the full bridge circuit 300. The isolated DC voltage sensor can be connected across a voltage divider that scales down the high DC voltage (e.g., 115 V or higher) from the power source to a level suitable for the amplifier's input and then amplifies and isolates this signal using capacitive isolation, transmitting an analog output to the processor on the low-voltage side. It also includes a Galvanic isolation function to prevent high voltages from feeding back into the control circuitry (e.g., via the full bridge connector), protecting the processor and low-voltage components of the appliance system. By monitoring the input DC voltage, the isolated DC voltage sensor can help maintain consistent performance, detect undervoltage or overvoltage conditions, and manage dynamic loads. The isolated DC voltage sensor can ensure that this monitoring is done accurately and safely, enabling robust power regulation even under changing conditions.

An isolated current sensor can be any suitable isolated current sensor that can sense the high-frequency AC current flowing through the load. As shown in FIG. 3, the isolated current sensor can be, for example, the Allegro MicroSystems® ACS37612. For example, when the load current passes through an internal conductor included in the isolated current sensor, a magnetic field is generated that is proportional to the current. The isolated current sensor can measure the magnetic field and convert it into a precise voltage or digital signal, proportional to the current, which then provides information for implementing safety algorithms such as suppressing ejection or levitation of a target material. The internal conductor can have very low resistance (e.g., in micro-ohms range), thereby minimizing power loss and heat generation. Under certain circumstances, the isolated current sensor can support system-level features like real-time overcurrent protection, current limiting, and target material characterization (e.g., detecting ferromagnetic response). Further, the isolated current sensor can maintain electrical isolation between the high-current power section and the low-voltage control electronics, protecting the system and the user.

In some implementations, the full bridge circuit 300 can include other components not described in detail above. For example, as shown in FIG. 3, the full bridge circuit 300 can include press-fit components that are used to attach terminal lugs, pins, or other electrical connectors to the power board or coil outputs. These connections are desirable for high-current paths, where solder joints may not be robust enough, ease of assembly, particularly in manufacturing settings, and serviceability, since press-fit components can be removed or replaced more easily than soldered ones. The full bridge circuit 300 can also include terminal lugs used to connect high-current paths, such as the output of the full bridge circuit 300 to the external induction coil. Terminal lugs are typically made from high-conductivity metals such as copper or aluminum, often plated with tin or other materials to prevent oxidation and improve conductivity. Further, the full bridge circuit 300 can include resonant capacitors that together with a load to form a resonant LC circuit. This LC (inductor-capacitor) network can determine the resonant frequency at which the system operates. Additional components included in the system can include but are not limited to HV buck converter (LNK3207D) to generate low-voltage supply rails (e.g., 15V, 5V, 3.3V), MOSFET NTCs for thermal monitoring, and live indicator LEDs for high-voltage presence, etc.

Figure 4A:
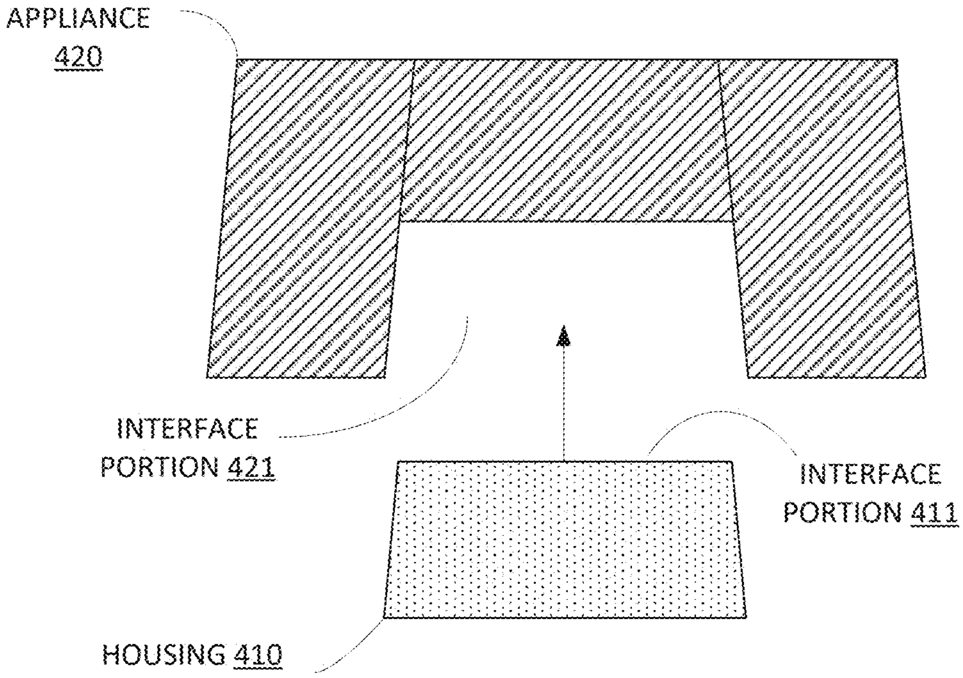
FIG. 4A shows an illustration of an example complementary fit of an interface portion of a housing with an interface portion of an appliance, according to an embodiment.

FIG. 4A is an illustration of an example complementary fit of an interface portion 411 of a housing 410 with an interface portion 421 of an appliance 420, according to an embodiment. The housing 410 can be structurally and/or functionally similar to the housing 101 of FIG. 1. The housing 410 can enclose a full bridge driver (e.g., the full bridge driver 110 of FIG. 1; not shown in FIG. 4A) configured to support operation of the appliance 420. The appliance 420 can be structurally and/or functionally similar to the appliance 120 of FIG. 1. As shown, the interface portion 421 of the appliance 420 can have various surfaces configured to receive the housing 410 based on the shape and/or size of the housing 410, thereby facilitating a complementary fit. A complementary fit can result in a form factor for the combined housing 410 and appliance 420 that is more compact, aesthetically pleasing, and structurally superior to a form factor produced by a non-complementary fit. In accordance with some embodiments of the present disclosure, however, the complementary fit between a housing enclosing a full bridge driver and an appliance can be a non-complementary fit (e.g., when an appliance is not manufactured specifically to couple with a full bridge driver). In such embodiments, an interface member (not shown) can be used to interconnect the housing and the appliance. For example, such an interface member on one side can have a complimentary fit with the housing and the interface member on an opposite side can have a complimentary fit with the appliance. Furthermore, such an interface member can have an aperture on one side and an aperture on the opposite side, which collectively can provide a passthrough for electrical and communication pathways between the housing and the appliance.

Figure 4B:
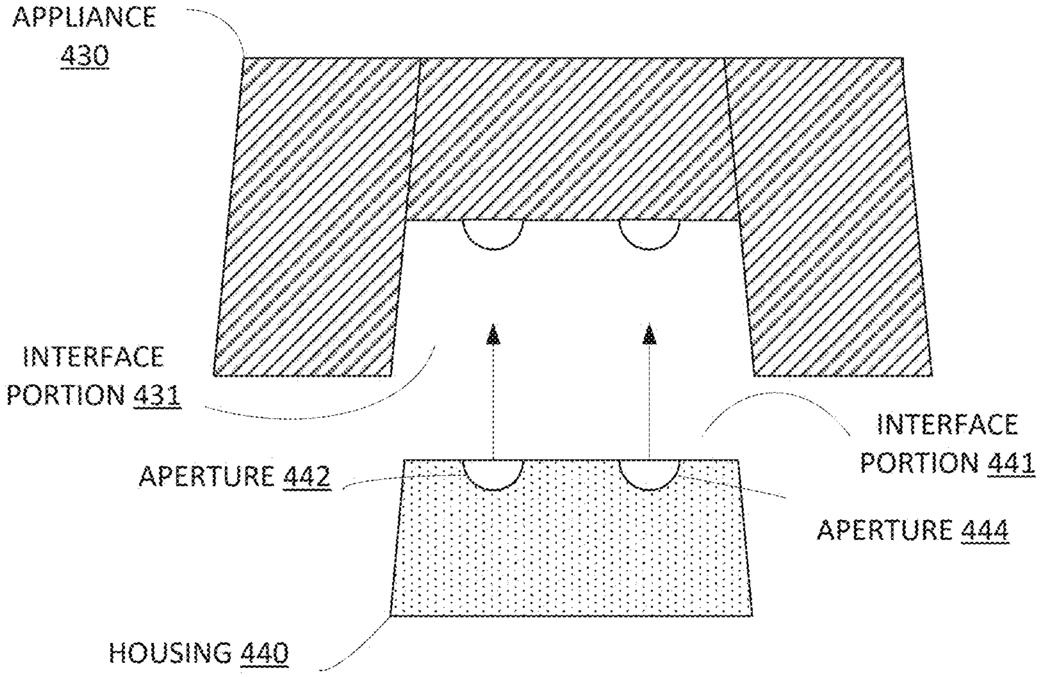
FIG. 4B shows an illustration of an example complementary fit of an interface portion of a housing with an interface portion of an appliance, according to an embodiment.

FIG. 4B is an illustration of an example complementary fit of an interface portion 441 of a housing with an interface portion 431 of an appliance 430, according to an embodiment. The housing 440 can be structurally and/or functionally similar to the housing 101 of FIG. 1. The housing 440 includes an aperture 442 and an aperture 444 on the interface portion 441, which, in some implementations of the appliance system disclosed herein, can provide access to various interface(s) of the full bridge driver enclosed by the housing 440. The aperture 442 and the aperture 444 can be complementarily fit with the interface portion 431 of the appliance 430, which can have portions that provide access to various interface(s) of the appliance 430. The appliance 430 can be structurally and/or functionally similar to the appliance 120 of FIG. 1. While shown and described in FIG. 4B as having two apertures, the housing 440 can have one or more apertures, recesses, or other suitable access points that facilitate electrical, mechanical, and/or communicative couplings between the appliance 430 and the full bridge driver enclosed by the housing 440.

In some embodiments or some implementations, a housing of a full bridge driver can have components other than or in addition to those described in FIGS. 4A-4B, which can result in a complementary fit or otherwise define a compatible coupling. In some implementations, the housing can have a protrusion (or passageway) configured to complementary fit to a matching passageway (or protrusion) of the appliance. The matching protrusion and passageway can define a key, which can ensure that only a compatible full bridge driver can be coupled with an appliance. In some instances, the key can be of a key system that includes different types of keys distinguished by different mechanical or magnetic features of the matching protrusion and passageway. For example, the matching protrusion and passageway that define a key can have detents that define a key type. In some instances, appliances can be configured to have keys of different key types. The mechanical/magnetic features of the matching protrusion and passageway can thereby be indicative of an appliance identifier (e.g., a serial number, etc.). In response to a fit between a matching protrusion and passageway (or other matching members) to a compatible appliance, the full bridge driver can be configured to initiate. For example, the fit between the matching protrusion and passageway can trigger switches (e.g., electromechanical switches such as relays, transistor-based switches, etc.), which can cause a signal to propagate to the processor.

In some implementations, a complementary fit between a housing of a full bridge driver and an appliance can complete a circuit, which can indicate that the full bridge driver has been removably coupled to a remaining portion of the appliance. For example, the appliance can have a magnetic member (e.g., a magnet) with electromagnetic properties that can be measured by a sensor (e.g., a hall sensor) at the full bridge driver of the housing. In response to detecting the electromagnetic member in the appliance, the sensor of the full bridge driver of the housing can cause the processor (e.g., the processor 212 of FIG. 2) to initiate various processes at the full bridge driver associated with, for example, supporting operation of the appliance. Instead, or in addition, housing can have a passive component(s) (e.g., a resistor(s), a capacitor(s), an inductor(s)) that can exhibit a strong response (e.g., a high amplitude within a narrow spectral band) when driven by a voltage source at the appliance. Features of the spectral band (e.g., a center frequency, a full-width at half maximum, a bandwidth, etc.) can be representative of an appliance identifier. In response to a driving of the passive components by the voltage source, the full bridge driver of the housing can cause the processor to initiate, based on the features of the spectral band.

In some implementations, a full bridge driver and an appliance can execute an authorization process (e.g., a handshaking process). The authorization process can include, for example, establishing communications, agreeing on communication parameters (e.g., a common communication protocol, encryption method, etc.), exchanging cryptographic keys (e.g., a public key of a public-private key pair), and/or other suitable measures. The authorization process can ensure that unauthorized full bridge drivers (e.g., full bridge drivers that fail the authorization process) cannot be used to support operation of appliances.

FIG. 5 shows a flow diagram of an example method 500 for controlling output in an induction heating system (e.g., the induction heating system 200 of FIG. 2), according to an embodiment. In some embodiments, the example method 500 comprises: receiving, at 505, a first measurement value from a sensor, the first measurement value being representative of a property of a conductive material disposed on an appliance; generating, at 510, a signal based on a first difference between the first measurement value and a target value that is input to the appliance; switching, at 515, a full bridge circuit to generate an alternating-current (AC) output based on the signal, the full bridge circuit being electrically coupled to a direct-current (DC) bus of the appliance, the DC bus being electrically coupled to a DC source; applying, at 520, the AC output to an induction coil to produce an alternating magnetic field that inductively heats the conductive material and that is at least partially shielded by an electromagnetic interference (EMI) shield; and receiving, at 525, a second measurement value from the sensor based on the alternating magnetic field, the second measurement value being representative of the property of the conductive material, a second difference between the second measurement value and the target value being less than the first difference.

In some such implementations, the DC bus has a root-mean square voltage between 110V and 130V, and the AC output has a peak-to-peak voltage between 220V and 260V.

In some such implementations, the sensor is at least one of a thermal sensor or a presence sensor.

In some embodiments, an apparatus comprises: a direct-current (DC) source configured to supply a first DC output during operation of a first appliance, the DC source configured to supply a second DC output during operation of a second appliance, the first DC output differing from the second DC output; a communication interface configured to be communicatively coupled with a communication bus of the first appliance; a processor communicatively coupled to the communication interface, the processor configured to generate, in response to receiving a first signal, a second signal indicating a switching frequency; and a full bridge circuit electrically coupled to the DC source and a remaining portion of the first appliance, the full bridge circuit configured to generate, based on the second signal, an AC output during operation of the first appliance to cause induction heating of a target material.

In some such implementations, the apparatus further comprises: an electromagnetic interference (EMI) shield disposed between the full bridge circuit and the target material, the EMI shield including at least one of aluminum or copper, the EMI shield configured to shield EMI associated with the AC output.

In some such implementations, the EMI shield has a plurality of elongated portions positioned circumferentially about a center location of the EMI shield, and each elongated portion from the plurality of elongated portions has a length in a radial direction greater than a width in a circumferential direction.

In some such implementations, the apparatus further comprises: a housing having an interface portion configured to complementarily fit with an interface portion of the first appliance, each of the DC source, the communication interface, the processor, and the full bridge circuit being included within the housing.

In some such implementations, the second signal is a pulse width modulation signal.

In some such implementations, the apparatus further comprises: a heat shield disposed between the full bridge circuit and the target material the heat shield including at least one of a silicate or a sheet silicate.

In some such implementations, the full bridge circuit includes a plurality of n-channel metal oxide semiconductive (CMOS) material field effect transistors (FETs).

In some such implementations, the AC output has a peak-to-peak voltage between 220V and 260V.

In some such implementations, the first DC output and the second DC output each have a voltage less than about 120 V.

In some embodiments, an apparatus comprises: a direct-current (DC) source configured to supply a first DC output during operation of a first appliance, the DC source configured to supply a second DC output during operation of a second appliance, the first DC output different from the second DC output; a sensor configured to produce a measurement value indicating a property of a target material; a processor configured to generate a signal based on the measurement value; and a full bridge circuit electrically coupled to the DC source, the full bridge circuit configured to generate, based on the signal, a first AC output during operation of the first appliance to cause induction heating of the target material, the full bridge circuit configured to generate, based on the signal, a second AC output during operation of the second appliance to cause induction heating of the target material, the first AC output differing from the second AC output.

In some such implementations, the sensor is a thermal sensor, the measurement value is at least one of a temperature value, a heat flux value, or a thermal resistance value.

In some such implementations, the sensor is a presence sensor, the property is an electromagnetic property.

In some such implementations, the apparatus further comprises: an electromagnetic interference (EMI) shield disposed between the full bridge circuit and the target material, the EMI shield including at least one of aluminum or copper.

In some such implementations, the first DC output and the second DC output each has a voltage less than about 120V.

In some such implementations, the first AC output and the second AC output each has a voltage less than about 240V.

In some such implementations, the signal is a pulse width modulation signal.

In some such implementations, the full bridge circuit includes a plurality of n-channel metal oxide semiconductive (CMOS) material field effect transistors (FETs).

In some embodiments, a method comprises: receiving a first measurement value from a sensor, the first measurement value being representative of a property of a conductive material disposed on an appliance; generating a signal based on a first difference between the first measurement value and a target value that is input to the appliance; switching a full bridge circuit to generate an alternating-current (AC) output based on the signal, the full bridge circuit being electrically coupled to a direct-current (DC) bus of the appliance, the DC bus being electrically coupled to a DC source; applying the AC output to an induction coil to produce an alternating magnetic field that inductively heats the conductive material and that is at least partially shielded by an electromagnetic interference (EMI) shield; and receiving a second measurement value from the sensor based on the alternating magnetic field, the second measurement value being representative of the property of the conductive material, a second difference between the second measurement value and the target value being less than the first difference.

In some such implementations, the DC bus has a root-mean square voltage between 110V and 130V, and the AC output has a peak-to-peak voltage between 220V and 260V.

In some such implementations, the sensor is at least one of a thermal sensor or a presence sensor.

Examples of computer code include, but are not limited to, micro-code or micro-instructions, machine instructions, such as produced by a compiler, code used to produce a web service, and files containing higher-level instructions that are executed by a computer using an interpreter. For example, embodiments can be implemented using Python, Java, JavaScript, C++, and/or other programming languages and development tools. Additional examples of computer code include, but are not limited to, control signals, encrypted code, and compressed code.

The drawings primarily are for illustrative purposes and are not intended to limit the scope of the subject matter described herein. The drawings are not necessarily to scale; in some instances, various aspects of the subject matter disclosed herein can be shown exaggerated or enlarged in the drawings to facilitate an understanding of different features. In the drawings, like reference characters generally refer to like features (e.g., functionally similar and/or structurally similar elements).

The acts performed as part of a disclosed method(s) can be ordered in any suitable way. Accordingly, embodiments can be constructed in which processes or steps are executed in an order different than illustrated, which can include performing some steps or processes simultaneously, even though shown as sequential acts in illustrative embodiments. Put differently, it is to be understood that such features can not necessarily be limited to a particular order of execution, but rather, any number of threads, processes, services, servers, and/or the like that can execute serially, asynchronously, concurrently, in parallel, simultaneously, synchronously, and/or the like in a manner consistent with the disclosure. As such, some of these features can be mutually contradictory, in that they cannot be simultaneously present in a single embodiment. Similarly, some features are applicable to one aspect of the innovations, and inapplicable to others.

Where a range of values is provided, it is understood that each intervening value, to the tenth of the unit of the lower limit unless the context clearly dictates otherwise, between the upper and lower limit of that range and any other stated or intervening value in that stated range is encompassed within the disclosure. That the upper and lower limits of these smaller ranges can independently be included in the smaller ranges is also encompassed within the disclosure, subject to any specifically excluded limit in the stated range. Where the stated range includes one or both of the limits, ranges excluding either or both of those included limits are also included in the disclosure.

The phrase "and/or," as used herein in the specification and in the embodiments, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements can optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the embodiments, "or" should be understood to have the same meaning as "and/or" as defined above. For example, when separating items in a list, "or" or "and/or" shall be interpreted as being inclusive, i.e., the inclusion of at least one, but also including more than one of a number or list of elements, and, optionally, additional unlisted items. Only terms clearly indicated to the contrary, such as "only one of" or "exactly one of," or, when used in the embodiments, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of." "Consisting essentially of," when used in the embodiments, shall have its ordinary meaning as used in the field of patent law.

As used herein in the specification and in the embodiments, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements can optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the embodiments, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

Some embodiments described herein relate to a computer storage product with a non-transitory computer-readable medium (also can be referred to as a non-transitory processor-readable medium and/or a machine-readable medium) having instructions or computer code thereon for performing various computer-implemented operations. The computer-readable medium (or processor-readable medium, machine-readable medium, etc.) is non-transitory in the sense that it does not include transitory propagating signals per se (e.g., a propagating electromagnetic wave carrying information on a transmission medium such as space or a cable). The media and computer code (also can be referred to as code) can be those designed and constructed for the specific purpose or purposes. Examples of non-transitory computer-readable media include, but are not limited to, magnetic storage media such as hard disks, floppy disks, and magnetic tape; optical storage media such as Compact Disc/Digital Video Discs (CD/DVDs), Compact Disc-Read Only Memories (CD-ROMs), and holographic devices; magneto-optical storage media such as optical disks; carrier wave signal processing modules; and hardware devices that are specially configured to store and execute program code, such as Application-Specific Integrated Circuits (ASICs), Programmable Logic Devices (PLDs), Read-Only Memory (ROM) and Random-Access Memory (RAM) devices. Other embodiments described herein relate to a computer program product, which can include, for example, the instructions and/or computer code discussed herein.

Some embodiments and/or methods described herein can be performed by software (executed on hardware), hardware, or a combination thereof. Hardware modules can include, for example, a processor, a field programmable gate array (FPGA), and/or an application specific integrated circuit (ASIC). Software modules (executed on hardware) can include instructions stored in a memory that is operably coupled to a processor and can be expressed in a variety of software languages (e.g., computer code), including C, C++, Java™, Ruby, Visual Basic™, and/or other object-oriented, procedural, or other programming language and development tools. Examples of computer code include, but are not limited to, micro-code or micro-instructions, machine instructions, such as produced by a compiler, code used to produce a web service, and files containing higher-level instructions that are executed by a computer using an interpreter. For example, embodiments can be implemented using imperative programming languages (e.g., C, Fortran, etc.), functional programming languages (Haskell, Erlang, etc.), logical programming languages (e.g., Prolog), object-oriented programming languages (e.g., Java, C++, etc.) or other suitable programming languages and/or development tools. Additional examples of computer code include, but are not limited to, control signals, encrypted code, and compressed code.

What is claimed is:

1. An apparatus, comprising:

a direct-current (DC) source configured to supply a first DC output during operation of a first appliance, the DC source configured to supply a second DC output during operation of a second appliance, the first DC output different from the second DC output;

a sensor configured to produce a measurement value indicating a property of a target material;

a processor configured to generate a signal based on the measurement value; and a full bridge circuit electrically coupled to the DC source, the full bridge circuit configured to generate, based on the signal, a first alternating-current (AC) output during operation of the first appliance to cause induction heating of the target material, the full bridge circuit configured to generate a second AC output during operation of the second appliance, the first AC output differing from the second AC output.

2. The apparatus of claim 1, wherein:

the sensor is a thermal sensor, the measurement value is at least one of a temperature value, a heat flux value, or a thermal resistance value.

3. The apparatus of claim 1, wherein:

the sensor is a presence sensor, the property is an electromagnetic property.

4. The apparatus of claim 1, further comprising:

an electromagnetic interference (EMI) shield disposed between the full bridge circuit and the target material, the EMI shield including at least one of aluminum or copper.

5. The apparatus of claim 1, wherein:

the first DC output and the second DC output each has a voltage less than about 120V.

6. The apparatus of claim 1, wherein:

the first AC output and the second AC output each has a voltage less than about 240V.

7. The apparatus of claim 1, wherein the signal is a pulse width modulation signal.

8. The apparatus of claim 1, wherein:

the full bridge circuit includes a plurality of n-channel metal oxide semiconductive (CMOS) material field effect transistors (FETs).

9. The apparatus of claim 1, wherein:

the full bridge circuit having a plurality of switches, the switching including switching the plurality of switches based on the signal, the signal is a pulse width modulation signal and representative of a frequency of a plurality of switches of the full bridge circuit during operation.

10. The apparatus of claim 1, wherein:

the measurement value is representative of contact between the target material and the first appliance; and the signal is indicative of abnormal EMI conditions associated with the contact between the target material and the first appliance.

11. A method, comprising:

supplying a first direct-current (DC) output from a DC source during operation of a first appliance;

supplying a second DC output from the DC source during operation of a second appliance, the first DC output differing from the second DC output;

producing, at a sensor, a measurement value indicating a property of a target material;

generating, at a processor a signal based on the measurement value; and generating, at a full bridge circuit electrically coupled to the DC source, a first alternating-current (AC) output during operation of the first appliance to cause induction heating of the target material; and generating, at the full bridge circuit and based on the signal, a second AC output during operation of the second appliance, the first AC output differing from the second AC output.

12. The method of claim 11, wherein:

the sensor is a thermal sensor, the measurement value is at least one of a temperature value, a heat flux value, or a thermal resistance value.

13. The method of claim 11, wherein:

the sensor is a presence sensor, the property is an electromagnetic property.

14. The method of claim 11, wherein:

an electromagnetic interference (EMI) shield is disposed between the full bridge circuit and the target material, the EMI shield including at least one of aluminum or copper.

15. The method of claim 11, wherein:

the first DC output and the second DC output each has a voltage less than about 120V.

16. The method of claim 11, wherein:

the first AC output and the second AC output each has a voltage less than about 240V.

17. The method of claim 11, wherein the signal is a pulse width modulation signal.

18. The method of claim 11, wherein:

the full bridge circuit includes a plurality of n-channel metal oxide semiconductive (CMOS) material field effect transistors (FETs).

19. The method of claim 11, wherein:

the property of the target material disposed on the first appliance indicates at least one of a size, a weight, a shape or a type of the target material on the first appliance, the generating the signal is based on the at least one of the size, the weight, the shape or the type of the target material on the first appliance.

20. The method of claim 11, further comprising:

calculating, based on the measurement value, a magnetic force exerted on the target material disposed on the first appliance, the generating the signal including generating the signal based on the magnetic force.

* * * * *